US005521568A

United States Patent [19]

Wu et al.

[11] Patent Number: 5,521,568

[45] Date of Patent: May 28, 1996

[54] ELECTRICAL DELAY LINE

[75] Inventors: Ruey-Beei Wu, Taipei; Fang-Lin Chao, Hsinchu, both of Taiwan

[73] Assignee: Industrial Technology Research Institute, Hsinchu, Taiwan

[21] Appl. No.: 416,169

[22] Filed: Apr. 4, 1995

[51] Int. Cl.[6] .................. H03H 7/30

[52] U.S. Cl. .................. 333/140; 333/162; 333/161; 336/232

[58] Field of Search .................. 333/12, 140, 162, 333/161, 160; 336/200, 232; 174/32, 33, 255

[56] References Cited

U.S. PATENT DOCUMENTS

| | | | |
|---|---|---|---|
| 2,843,829 | 7/1958 | Slate | 336/232 X |
| 3,581,264 | 5/1971 | Person | 336/232 X |
| 4,675,625 | 6/1987 | Johnson | 333/161 |
| 4,675,627 | 6/1987 | Johnson | 333/161 |
| 4,942,373 | 7/1990 | Ozawa et al. | 333/161 |

FOREIGN PATENT DOCUMENTS

| | | | |
|---|---|---|---|
| 2453851 | 5/1976 | Germany | 333/161 |

*Primary Examiner*—Paul Gensler
*Attorney, Agent, or Firm*—George O. Saile

[57] ABSTRACT

An electrical delay line is described. Said line is free from early or late arriving false signals of sufficient amplitude to trigger subsequent stages in the circuitry. This has been accomplished through use of a novel approach to designing the delay line. Said approach is described and data is given comparing conventional delay lines with the present invention.

17 Claims, 4 Drawing Sheets

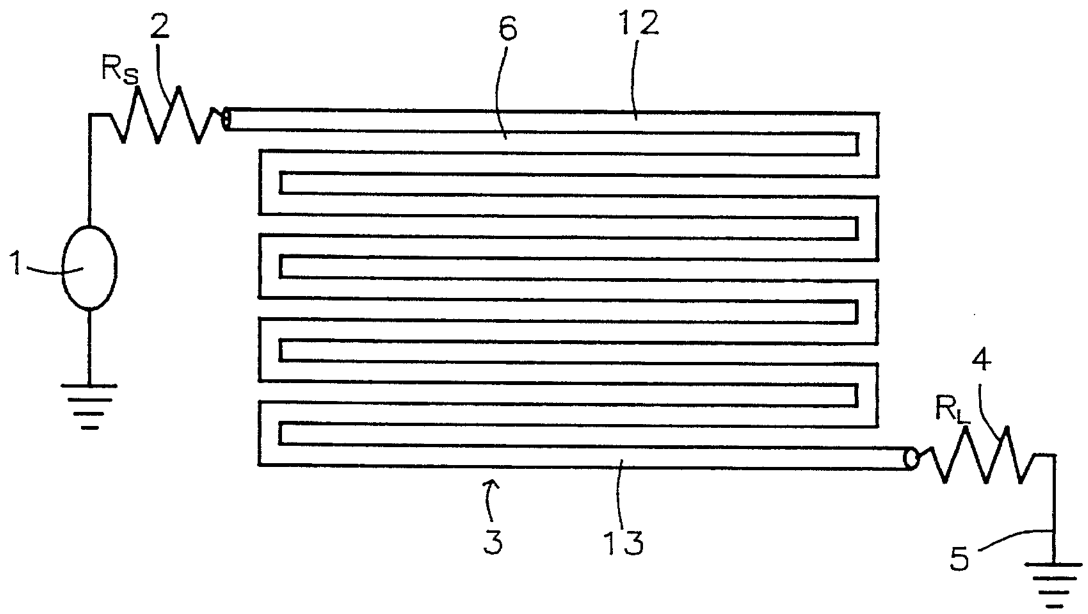
FIG. 1 - Prior Art
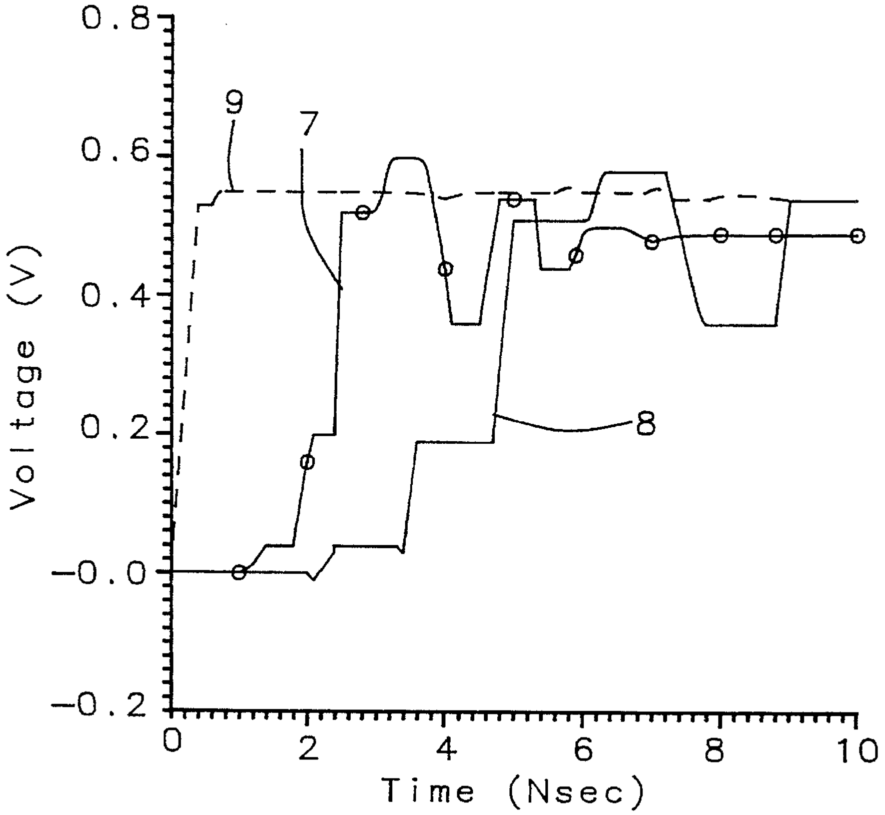
FIG. 2 - Prior Art

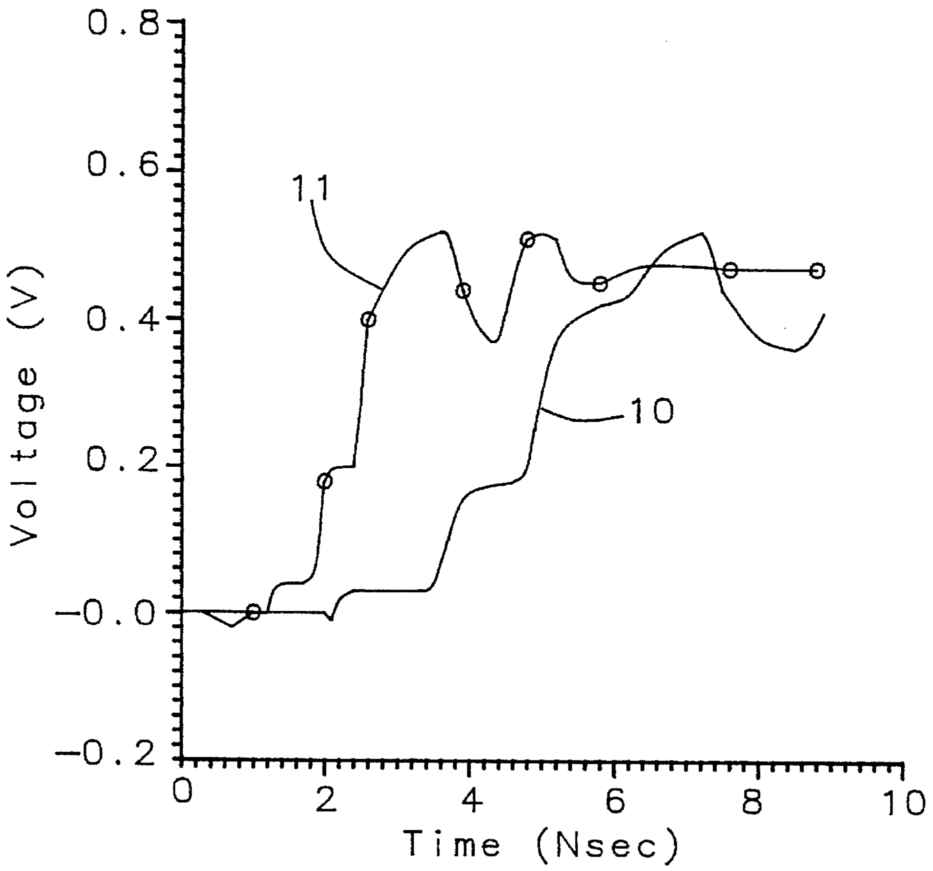
*FIG. 3 - Prior Art*
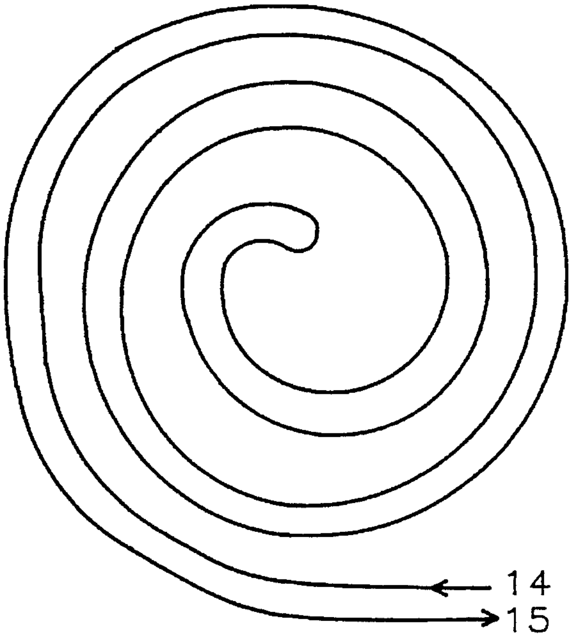
*FIG. 4*

ELECTRICAL DELAY LINE

BACKGROUND OF THE INVENTION

1. Field of the Invention

The invention relates to the field of high speed digital electronic circuitry, more particularly to electrical delay lines and methods for their design.

2. Description of the Prior Art

In the design of high speed electronic circuits it is often essential that the difference in the arrival times between two or more electrical signals at a given point in the circuit be less than some prespecified amount. When this cannot be readily achieved by other means, it becomes necessary to insert some electrical delay in the path(s) of the early arriving signal(s).

One means of providing the needed delay is through use of a delay line. This consists essentially of an appropriate length of an interconnect line. For reasons of packaging efficiency it is necessary to shape the delay line into a form that occupies as little space as possible. A shape that is widely used in the electronics industry for this purpose is the so-called serpentine. The conducting wire that constitutes a serpentine delay line winds back and forth in the same plane to create a series of parallel sections that are connected at alternating ends as shown in FIG. 1. Original signal 1, emerging from source resistance, $R_s$, 2 enters delay line 3 sending to loading resistance, $R_1$, 4. The overall dimensions of such a delay line would, in general, be between 0.5 and 13 cm. separation by between 10 microns and 0.3 cm., for a total line length of between 5 and 117 cm.

Typically the spacing 6 between adjoining sections of a serpentine delay line would be about 0.1 mm. which is close enough for significant cross-talk between sections to occur. That is, a small amount of the signal that is travelling down a given section will be induced in adjoining sections. In the serpentine design the timing is such that the signals induced in the various sections, as the main signal travels past them, all arrive at the same time at the end of the delay line before the real signal, producing a false signal that can be above the threshold voltage of the digital circuit.

An example of this is shown in FIG. 2. Curve 7 is for a serpentine delay line of length 5 cm. while curve 8 is for a 10 cm. line. Curve 9 shows the shape and timing of the sending-end signal. These curves were created through simulation, as reported by Wu and Chao in 'laddering wave in serpentine delay line' published in the proceedings of the IEEE EPEP Conference held in California in September 1994 (pages 124 to 127). The intended delays for the 5 cm. and 10 cm. lines were 3.0 and 6.0 nsec respectively, whereas, as can be seen, significant rises in the arriving signals are already occuring after 2.3 and 4.6 nsecs respectively. The same data obtained through actual measurements are shown in FIG. 3 and can be seen to be very similar to the simulation data. Curve 10 corresponds to curve 8 in FIG. 2 and curve 11 corresponds to curve 7 in FIG. 2.

The highly undesirable early-arriving false signal effect could, in principle, be mitigated through a reduction in the cross-talk between the various sections of the serpentine delay line. Unfortunately, the two ways to accomplish this are to slow down the circuits involved or to increase the spacing between the various sections of the serpentine line and neither solution is acceptable.

SUMMARY OF THE INVENTION

A principal object of the present invention has been to develop a compact electrical delay line that occupies no more space than an equivalent serpentine delay line but does not generate spurious early signals of significant amplitude.

This has been accomplished through the development of a delay line that occupies the same area as a serpentine but is wound differently from it. Cross-talk still occurs in the design that constitutes the present invention but the various induced signals do not all exit the delay line at the same time so the maximum amplitude of any early-arriving signals is kept well below the threshold value of any devices with which they subsequently interact.

BRIEF DESCRIPTION OF THE DRAWINGS

FIG. 1 shows a serpentine delay line.

FIG. 2 shows curves, created by simulation, of sent and received signals through a serpentine delay line.

FIG. 3 shows the data described in FIG 2 but obtained through actual measurement.

FIG. 4 shows a spiral delay line.

DESCRIPTION OF THE PREFERRED EMBODIMENTS

Figure 5:
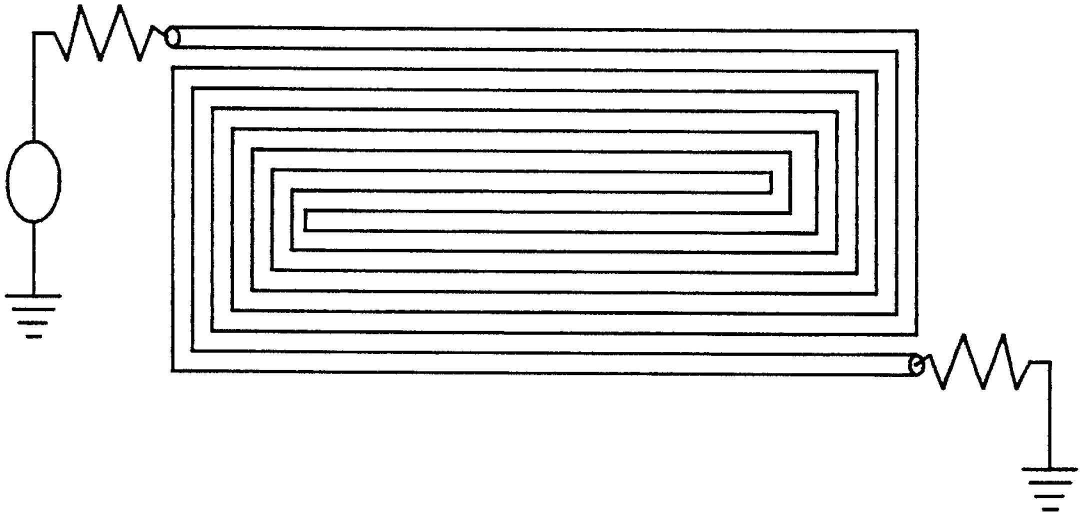
FIG. 5 shows a delay line wound according to the teaching of the present invention.

Referring once more to FIG. 1, if we number the horizontal sections of the serpentine delay line that is shown there, starting with the section marked 12 in the drawing as number 1 and section 13 as number 9, we can make a first order estimate of the arrival time at 4 of signals induced as a result of cross-talk. If the time for an electrical signal to traverse one of the sections of the delay line is 1 unit then the total delay introduced by the line will be 9 units.

As the main signal, starting at time 0, moves from left to right along section 1, a signal is induced (as a result of cross-talk) in section 2. The induced signal moves towards the end of the delay line (initially from right to left along section 2). Thus, the induced signal first appears at time 0 at the left end of section 2. The signal induced as a result of cross-talk with section 1 continues to be created as the main signal moves to the right end of section 1 which it reaches at time 1. Thus the signal induced in section 2 as a result of the main signal travelling down section 1 first appears at the end of the delay line at time 7 (the number of sections to traverse from the left of section 2 to the end). It continues to be present until time 9 (1+the number of sections to traverse from the right of section 2 to the end).

A similar analysis may be performed for each section of the delay line as the main signal moves through. This shows that, no matter which section the main signal is traversing, the induced signal will always arrive at the delay line's end at time 7–9. For the sake of completeness it should also be mentioned that as the main signal traverses sections 2 through 9, signals are induced in the sections both above and below. For example, as the main signal traverses section 2 it induces a cross-talk signal in section 1 as well as in section 3. It turns out that the signal induced in section 1 arrives at the delay line end during time 9–11, as do all the other subsequently induced late signals.

Fortunately, the premature arrival of false signals at the end of a delay line can be tolerated in many circuit designs if the amplitudes of such false signals are too low to trigger activity at the next stage. In particular, if the delay line can be wound in such a way that the arrival of false signals at the end of the line is spread out in time, the false signals will not be superimposed on one another and the critical amplitude will never be reached.

Consider now the spiral delay line illustrated in FIG. 4. The signal that is to be delayed enters at 14 and emerges at 15. As the main signal travels away from 14 towards the center of the spiral, an induced signal immediately begins to exit at 15, early by an amount that is equal to the line's intended delay time. As the main signal nears the center of the spiral, the false signal's arrival time gradually approaches the intended delay time and, once the main signal has passed the center, the false signal begins to arrive ever later until the signal that was induced at 14 as the main signal emerged at 15, arrives one full delay time late.

Although the spiral delay line just described meets the key requirement of spreading the false signals out in time, its shape is not well suited to packaging requirements, a rectangular shape similar to the serpentine line seen in FIG. 1 being preferred. In FIG. 5 we show a rectangularly shaped version that remains topologically equivalent to the spiral version seen in FIG. 4. It can be thought of as FIG. 4 compressed in one dimension, expanded in the other, and all curves then straightened out.

A first order delay analysis similar to the one discussed earlier for the serpentine delay line can now be performed for the nine section delay line of FIG. 5. As before, the sections are numbered from 1 to 9, starting at the top, and the time for a signal to traverse one section is one unit. The results are shown in TABLE I.

TABLE I

| time | main signal at section | arrival time range of false signal: 1 | 3 | 5 | 7 | 9 | 11 | 13 | 15 | 17 |
|---|---|---|---|---|---|---|---|---|---|---|
| 0 | 1 | ------ | | | | | | | | |
| 1 | 8 | ----- | ------ | | | | | | | |
| 2 | 3 | | ----- | ----- | | | | | | |
| 3 | 6 | | | ----- | ----- | | | | | |
| 4 | 5 | | | | ----- | | | | | |
| 5 | 4 | | | | | | --- | --- | | |
| 6 | 7 | | | | | | --- | ---- | ---- | |
| 7 | 2 | | | | | | | --- | ---- | ---- |
| 8 | 9 | | | | | | | | | ------ |

Figure 6:
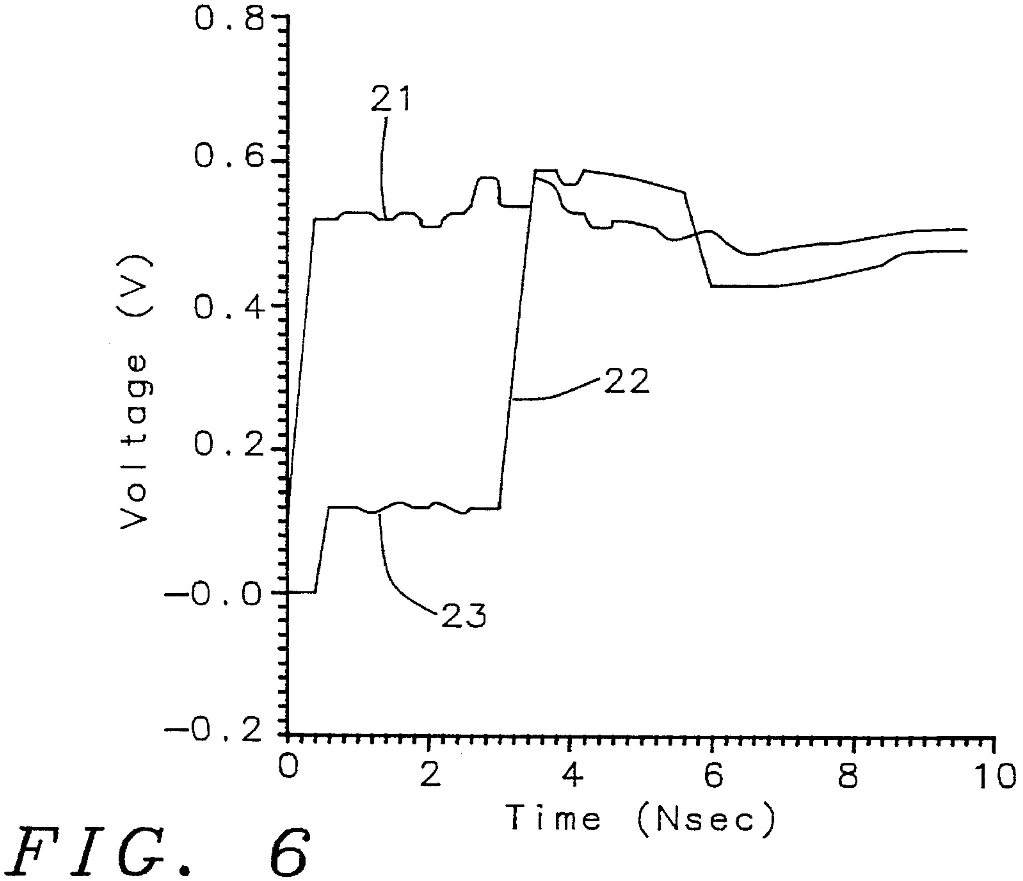
FIG. 6 shows curves, created by simulation, of sent and received signals through a delay line based on the present invention.

These results show that a delay line wound as shown in FIG. 5 does disperse the arrival times of false signals that originate within the body of the delay line as a consequence of cross-talk between different sections. This was further confirmed through simulation, the result being shown in FIG. 6. The intended delay for the delay line that was being simulated was 3 nanoseconds. Curve 21 is for the main signal at the sending end while curve 22 illustrates its shape as it emerged at the receiving end.

The portion of the curve marked as 23 represents early arriving false signals that have been created as a result of cross-talk. Note that they have been spread out in time and have therefore not built up to a sufficient amplitude to cause a problem. In this particular example the maximum amplitude of the early arriving false signals was 0.12 volts which is less than 25% of the saturation voltage for the transistors involved in this design—well below the threshold voltage at which they would be triggered.

To confirm that the delay line that constitutes the present invention operated as claimed, a working model was built and tested. Said model was composed of nine sections, each of width 0.85 mm. (although any width between 10 microns and 2 mm. could have been used) and of length 13 cm. (although any length between 0.5 and 13 cm. could have been used) for a total length of 117 cm. The distance separating the segments from one another was 0.4 mm. (although any separation distance between 10 microns and 3 mm. could have been used). The thickness of the segments was approximately 0.1 mm. (although any thickness between 1 micron and 1 mm. could have been used) and they were created by etching copper clad fiber-glass (more specifically, an FR-4 board) using standard printed circuit board technology. In order to control the impedance of the main signal line a ground plane was provided. This was positioned approximately 1.4 mm. below the plane of the delay line itself (although any value between 20 microns and 2.5 mm. could have been used).

Figure 7:
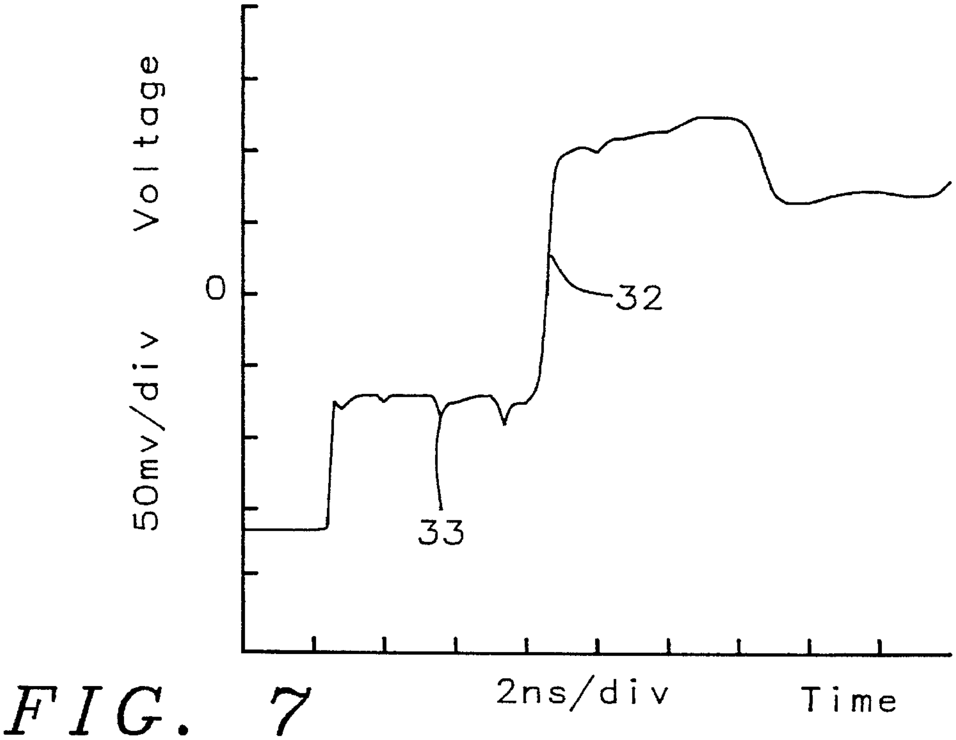
FIG. 7 shows the data described in FIG. 6 but obtained through measurements on a working model of the present invention.

The results of measurements made on the working model are shown in FIG. 7. Curves 32 and 33 in FIG. 7 correspond to curves 22 and 23 respectively in FIG. 6.

It should be noted that while the delay line of the present invention could be generated from a spiral delay line, as described above, by compressing along one dimension and expanding along the other, it can more easily be constructed by providing an odd number of sections of equal length, laying them out side by side and then connecting them according to the following formula:

on the left side connect section n-(i−1) to section i+1 on the right side connect section n-i to section i where n is the number of sections and i goes from i=1 to i=(n−1)/2.

While the invention has been particularly shown and described with reference to this preferred embodiment, it will be understood by those skilled in the art that various changes in form and details may be made without departing from the spirit and scope of the invention.

What is claimed is:

1. An electrical delay line comprising:

an odd plurality, at least five, of linear, electrically conductive, wires, each of said wires having a single left end and a single right end, all of said wires lying in the same plane and all of said wires disposed so as to be parallel one to another and evenly spaced relative to one another;

a first plurality of electrically conductive connections, wherein the time required for an electrical signal to traverse their length is negligible compared to the time required for an electrical signal to traverse the length of one of said electrically conductive wires, connecting said left ends:

the uppermost but one wire in said odd plurality being connected to the lowermost wire in said odd plurality, the uppermost but two wire in said odd plurality being connected to the lowermost but one wire in said odd plurality, and so on, each of said left ends being thus connected to one, and only one, of the other left ends;

a second plurality of electrically conductive connections, wherein the time required for an electrical signal to traverse their length is negligible compared to the time required for an electrical signal to traverse the length of one of said electrically conductive wires, connecting said right ends:

the uppermost wire in said odd plurality being connected to the lowermost but one wire in said odd plurality, the uppermost but one wire in said odd plurality being connected to the lowermost but two wire in said odd plurality, and so on, each of said right ends being thus connected to one, and only one, of the other right ends; and means for maintaining the relative positions of said wires.

2. The structure described in claim 1 wherein the length of each of said electrically conductive wires is between 0.5 and 13 cm.

3. The structure described in claim 1 wherein said electrically conductive lines have a rectangular cross-section, a width between 10 microns and 2 mm., and a thickness between 1 micron and 1 mm.

4. The structure described in claim 1 wherein the distance separating said electrically conducting lines is between 10 microns and 3 mm.

5. The structure described in claim 1 wherein said means for maintaining the relative positions of said electrically conductive wires comprises a rigid substrate onto which said electrically conductive wires have been deposited.

6. The structure described in claim 1 wherein said means for maintaining the relative positions of said electrically conductive wires comprises their encapsulation within a sheet of material taken from the group consisting of polyimide, FR-4, and a dielectric coating.

7. An electrical delay line as described in claim 1 further comprising a ground plane that is parallel with the plane of said electrically conductive lines and separated therefrom by a distance of between 20 microns and 2.5 mm.

8. An electrical delay line comprising:

five linear, electrically conductive, wires, each of said wires having a single left end and a single right end, all of said wires lying in the same plane and all of said wires disposed so as to be parallel one to another and evenly spaced relative to one another;

two electrically conductive connections, wherein the time required for an electrical signal to traverse their length is negligible compared to the time required for an electrical signal to traverse the length of one of said electrically conductive wires, connecting said left ends:

the second wire of said five wires being connected to the last wire of said five wires and the third wire of said five wires being connected to the fourth wire of said five wires;

two additional electrically conductive connections, wherein the time required for an electrical signal to traverse their length is negligible compared to the time required for an electrical signal to traverse the length of one of said electrically conductive wires, connecting said right ends:

the first wire of said five wires being connected to the fourth wire of said five wires and the second wire of said five wires being connected to the third wire of said five wires; and means for maintaining the relative positions of said wires.

9. An electrical delay line comprising:

seven linear, electrically conductive, wires, each of said wires having a single left end and a single right end, all of said wires lying in the same plane and all of said wires disposed so as to be parallel one to another and evenly spaced relative to one another;

three electrically conductive connections, wherein the time required for an electrical signal to traverse their length is negligible compared to the time required for an electrical signal to traverse the length of one of said electrically conductive wires, connecting said left ends:

the second wire of said seven wires being connected to the last wire of said seven wires, the third wire of said seven wires being connected to the sixth wire of said seven wires and the fourth wire of said seven wires being connected to the fifth wire of said seven wires;

three additional electrically conductive connections, wherein the time required for an electrical signal to traverse their length is negligible compared to the time required for an electrical signal to traverse the length of one of said electrically conductive wires, connecting said right ends:

the first wire of said seven wires being connected to the sixth wire of said seven wires, the second wire of said seven wires being connected to the fifth wire of said seven wires and the third wire of said seven wires being connected to the fourth wire of said seven wires; and means for maintaining the relative positions of said wires.

10. An electrical delay line comprising:

nine linear, electrically conductive, wires, each of said wires having a single left end and a single right end, all of said wires lying in the same plane and all of said wires disposed so as to be parallel one to another and evenly spaced relative to one another;

four electrically conductive connections, wherein the time required for an electrical signal to traverse their length is negligible compared to the time required for an electrical signal to traverse the length of one of said electrically conductive wires, connecting said left ends:

the second wire of said nine wires being connected to the last wire of said nine wires, the third wire of said nine wires being connected to the eighth wire of said nine wires, the fourth wire of said nine wires being connected to the seventh wire of said nine wires and the fifth wire of said nine wires being connected to the sixth wire of said nine wires;

four additional electrically conductive connections, wherein the time required for an electrical signal to traverse their length is negligible compared to the time required for an electrical signal to traverse the length of one of said electrically conductive wires, connecting said right ends:

the first wire of said nine wires being connected to the eighth wire of said nine wires, the second wire of said nine wires being connected to the seventh wire of said nine wires, the third wire of said nine wires being connected to the sixth wire of said seven wires and the fourth wire of said nine wires being connected to the fifth wire of said nine wires; and means for maintaining the relative positions of said wires.

11. An electrical delay line comprising:

eleven linear, electrically conductive, wires, each of said wires having a single left end and a single right end, all of said wires lying in the same plane and all of said wires disposed so as to be parallel one to another and evenly spaced relative to one another;

five electrically conductive connections, wherein the time required for an electrical signal to traverse their length is negligible compared to the time required for an electrical signal to traverse the length of one of said electrically conductive wires, connecting said left ends:

the second wire of said eleven wires being connected to the last wire of said eleven wires, the third wire of said eleven wires being connected to the tenth wire of said eleven wires, the fourth wire of said eleven wires being connected to the ninth wire of said eleven wires, the fifth wire of said eleven wires being connected to the eighth wire of said eleven wires and the sixth wire of said eleven wires being connected to the seventh wire of said eleven wires;

five additional electrically conductive connections, wherein the time required for an electrical signal to traverse their length is negligible compared to the time required for an electrical signal to traverse the length of one of said electrically conductive wires, connecting said right ends:

the first wire of said eleven wires being connected to the tenth wire of said eleven wires, the second wire of said eleven wires being connected to the ninth wire of said eleven wires, the third wire of said eleven wires being connected to the eighth wire of said seven wires, the fourth wire of said eleven wires being connected to the seventh wire of said eleven wires and the fifth wire of said eleven wires being connected to the sixth wire of said eleven wires; and means for maintaining the relative positions of said wires.

12. The structure described in claim 8 or claim 9 or claim 10 or claim 11 wherein the length of each of said electrically conductive wires is between 0.5 and 13 cm.

13. The structure described in claim 8 or claim 9 or claim 10 or claim 11 wherein said electrically conductive lines have a rectangular cross-section, a width between 10 microns and 2 mm., and a thickness between 1 micron and 1 mm.

14. The structure described in claim 8 or claim 9 or claim 10 or claim 11 wherein the distance separating said electrically conducting lines is between 10 microns and 3 mm.

15. The structure described in claim 8 or claim 9 or claim 10 or claim 11 wherein said means for maintaining the relative positions of said electrically conductive wires comprises a rigid substrate onto which said electrically conductive wires have been deposited.

16. The structure described in claim 8 wherein said means for maintaining the relative positions of said electrically conductive wires comprises their encapsulation within a sheet of material taken from the group consisting of polyimide, FR-4, and a dielectric coating.

17. The structure described in claim 8 or claim 9 or claim 10 or claim 11 further comprising a ground plane that is parallel with the plane of said electrically conductive lines and separated therefrom by a distance of between 20 microns and 2.5 mm.

* * * * *